(12) United States Patent
Ahmed et al.

(10) Patent No.: US 10,565,917 B2
(45) Date of Patent: Feb. 18, 2020

(54) MONOLITHIC MICRO LED DISPLAY

(71) Applicant: INTEL CORPORATION, Santa Clara, CA (US)

(72) Inventors: Khaled Ahmed, Anaheim, CA (US); Kunjal Parikh, San Jose, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/390,371

(22) Filed: Dec. 23, 2016

(65) Prior Publication Data

US 2018/0182275 A1 Jun. 28, 2018

(51) Int. Cl.
*G09G 3/20* (2006.01)
*H01L 29/786* (2006.01)
*H01L 27/15* (2006.01)
*H01L 29/66* (2006.01)
*G09G 3/30* (2006.01)
*H01L 27/12* (2006.01)
*H01L 21/02* (2006.01)

(52) U.S. Cl.
CPC ............. *G09G 3/2003* (2013.01); *G09G 3/30* (2013.01); *H01L 27/1225* (2013.01); *H01L 27/1259* (2013.01); *H01L 27/156* (2013.01); *H01L 29/66742* (2013.01); *H01L 29/66969* (2013.01); *H01L 29/7869* (2013.01); *H01L 29/78681* (2013.01); *G09G 2300/0465* (2013.01); *G09G 2320/066* (2013.01); *G09G 2320/0626* (2013.01); *G09G 2330/023* (2013.01); *H01L 21/02565* (2013.01)

(58) Field of Classification Search
CPC ................... G09G 3/2003; G09G 3/30; G09G 2300/0465; G09G 2320/0626; G09G 2320/066; G09G 2330/023; H01L 21/02543; H01L 21/02565; H01L 21/0262; H01L 29/66522; H01L 29/66742; H01L 29/6606; H01L 29/78681; H01L 29/7869
See application file for complete search history.

(56) References Cited

U.S. PATENT DOCUMENTS

| | | | | |
|---|---|---|---|---|
| 5,789,766 | A | * | 8/1998 | Huang .................. H01L 27/156 257/83 |
| 5,798,535 | A | * | 8/1998 | Huang .................. H01L 27/156 257/83 |
| 5,827,753 | A | * | 10/1998 | Huang .................. H01L 27/156 438/24 |

(Continued)

OTHER PUBLICATIONS

Kapadia, R., "Material Science and Device Physics of Semiconductors on Arbitrary Substrates", PhD thesis, <http://www.eecs.berkeley.edu/Pubs/TechRpts/2013/EECS-2013-121.pdf>, University of California Berkeley, Jun. 2013, 85 pages.

*Primary Examiner* — Ariel A Balaoing

(57) ABSTRACT

A micro display, which includes LEDs and TFTs of a TFT electronic control circuit for controlling the LEDs, is produced monolithically on a silicon, silicon carbide, or sapphire wafer. The display includes red, green, and blue micro LEDs, and electronic control circuits include TFTs with Indium gallium zinc oxide (IGZO) channels or Indium phosphide (InP) channels. The TFTs are formed above the LEDs and laterally removed from the LEDs and paths of light emissions from the plurality of LEDs to prevent light blocking by the TFTs.

14 Claims, 14 Drawing Sheets

(56) References Cited

U.S. PATENT DOCUMENTS

| | | | | |
|---|---|---|---|---|
| 5,952,680 A | * | 9/1999 | Strite | H01L 27/156 |
| | | | | 257/88 |
| 2011/0309378 A1 | * | 12/2011 | Lau | H01L 27/156 |
| | | | | 257/88 |
| 2012/0223875 A1 | * | 9/2012 | Lau | H01L 27/156 |
| | | | | 345/83 |

* cited by examiner

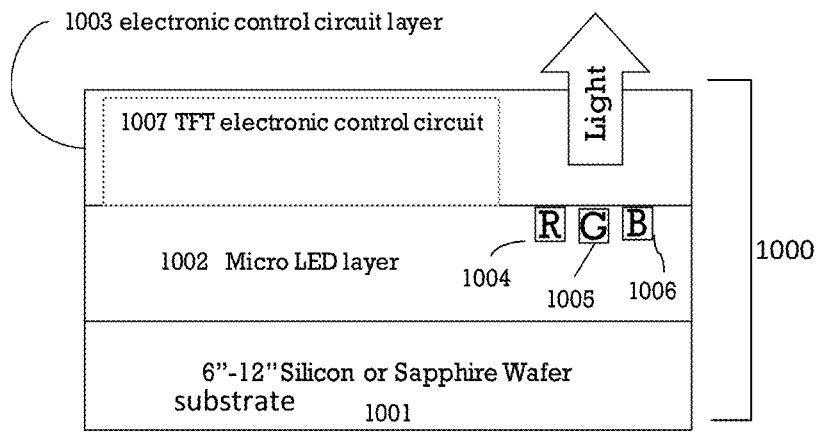
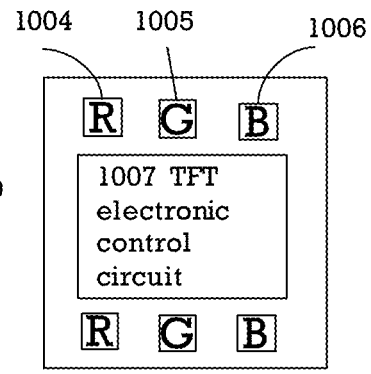
Fig. 1a          Fig. 1b
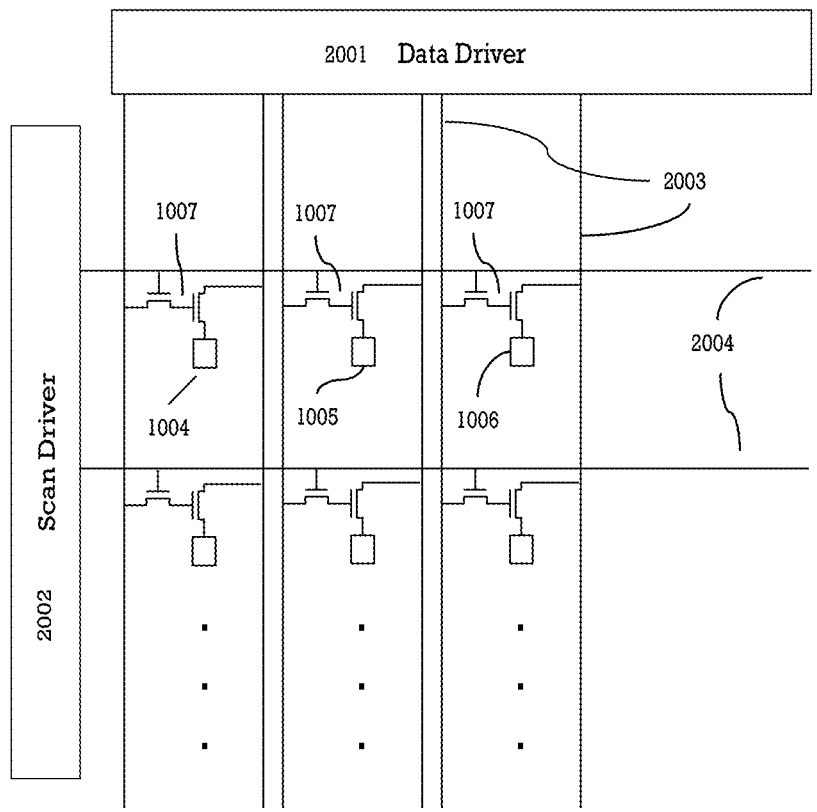
Fig. 2

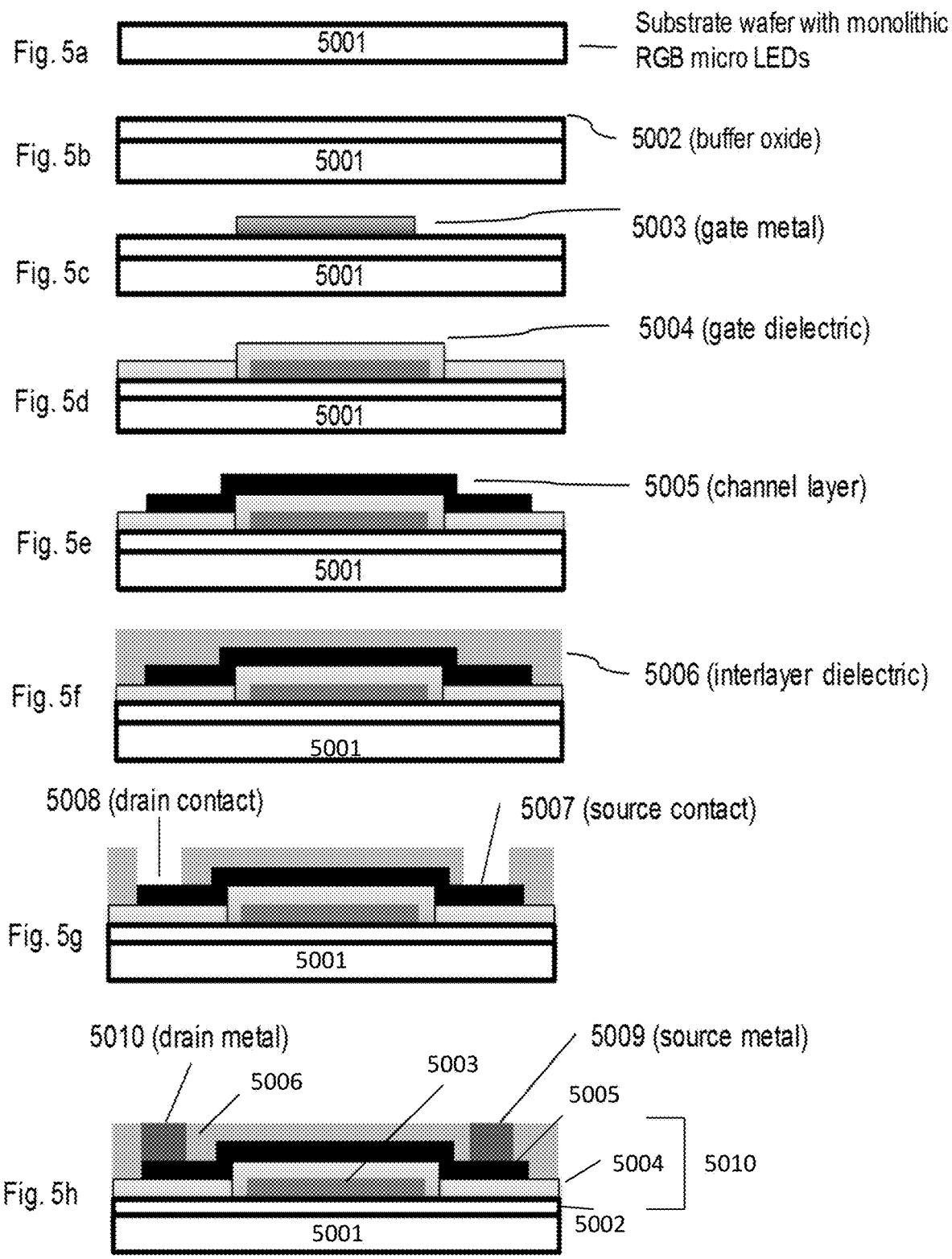

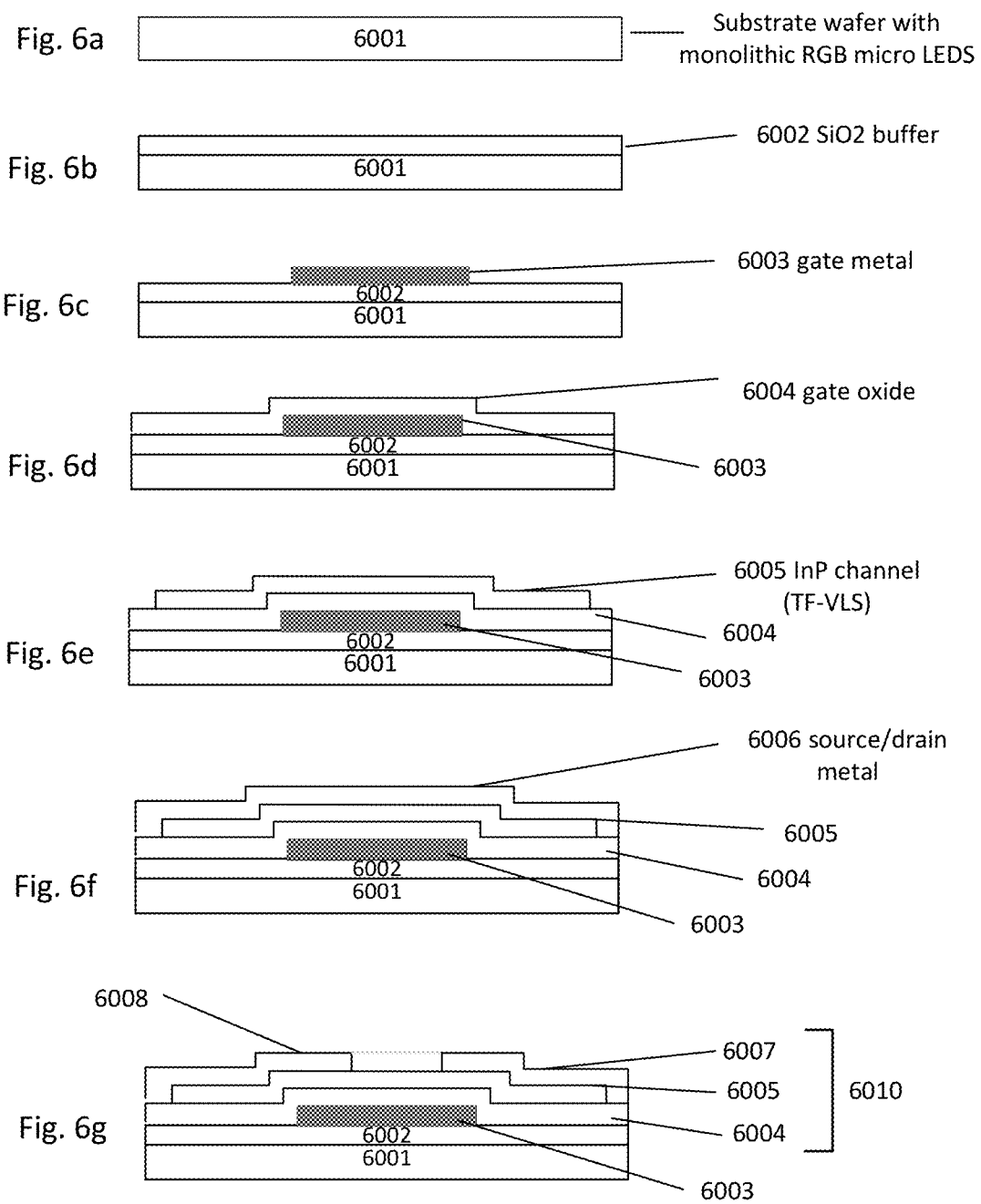

500

Deposit buffer oxide on top of a layer configuration including a substrate wafer with monolithic R, G, B micro LEDs of a micro LED layer.
510

Deposit and pattern gate metal.
520

Deposit a gate dielectric layer above the gate metal.
530

Form a channel layer (e.g., IGZO) above the gate dielectric (e.g., by atomic layer deposition at T < 500°C).
540

Deposit interlayer dielectric on top of the channel layer.
550

Open source and drain contacts.
560

Form source metal and drain metal by deposition and patterning.
570

Deposit SiO2 buffer on top of a layer configuration including a substrate wafer with monolithic R, G, B micro LEDs of a micro LED layer.
610

Deposit and pattern gate metal.
620

Deposit a gate dielectric (e.g., oxide) layer above the gate metal.
630

Form a channel layer (e.g., InP) above the gate dielectric (e.g., by TF-VLS).
640

Deposit a metal layer for source and drain metal on top of the InP channel layer.
650

Form source metal portion and drain metal portion by patterning and thermal annealing.
660

Produce a micro LED layer including R, G, B micro LEDs on top of the substrate wafer.
1110

Produce an electronic control circuit layer above the micro LED layer monolithically, which electronic control circuit layer includes electronic control circuits made of TFTs which are positioned at a laterally different area from the micro LEDs of the micro LED layer
1120

FIG. 11

MONOLITHIC MICRO LED DISPLAY

TECHNICAL FIELD

Embodiments herein generally relate to micro displays which include (i) micro light emitting diodes (LEDs) on a wafer and (ii) electronic control circuits made of thin film transistors (TFTs) provided on the same wafer as the LEDs.

BACKGROUND

As consumer and industrial markets move towards augmented reality (AR) and virtual reality (VR) applications, there is a pressing need for a full color, high brightness, high contrast and low power micro displays (e.g., less than 1" in size) suitable for wearable head mounted display (HMD) applications. Micro LED displays have many of these desired characteristics for HMD applications.

BRIEF DESCRIPTION OF THE DRAWINGS

FIG. 1a illustrates a layer sequence of the monolithic construction including micro LEDs and TFT electronic control circuit according to an embodiment.

FIG. 1b illustrates a top view of the monolithic construction including micro LEDs and TFT electronic control circuit according to an embodiment.

FIG. 2 illustrates a block diagram of the connection amongst driver circuits, TFT electronic control circuits, and micro LEDs according to an embodiment.

FIGS. 5a-5h illustrate cross-sectional views of component layers at different stages of manufacturing a TFT of the TFT electronic control circuit provided on top of the micro LED layer according to an embodiment.

FIGS. 6a-6g illustrate cross-sectional views of component layers at different stages of manufacturing a TFT of the TFT electronic control circuit provided on top of the micro LED layer according to another embodiment.

FIG. 9 illustrates a logic flow of a method for producing a TFT of the TFT electronic control circuit provided on top of the micro LED layer as illustrated in FIGS. 5a-5h.

FIG. 10 illustrates a logic flow of a method for producing a TFT of the TFT electronic control circuit provided on top of the micro LED layer as illustrated in FIGS. 6a-6g.

FIG. 11 illustrates a logic flow of a method for producing a micro display which includes micro LEDs on a wafer and TFT electronic control circuits provided on the same wafer.

DETAILED DESCRIPTION

Figure 3:
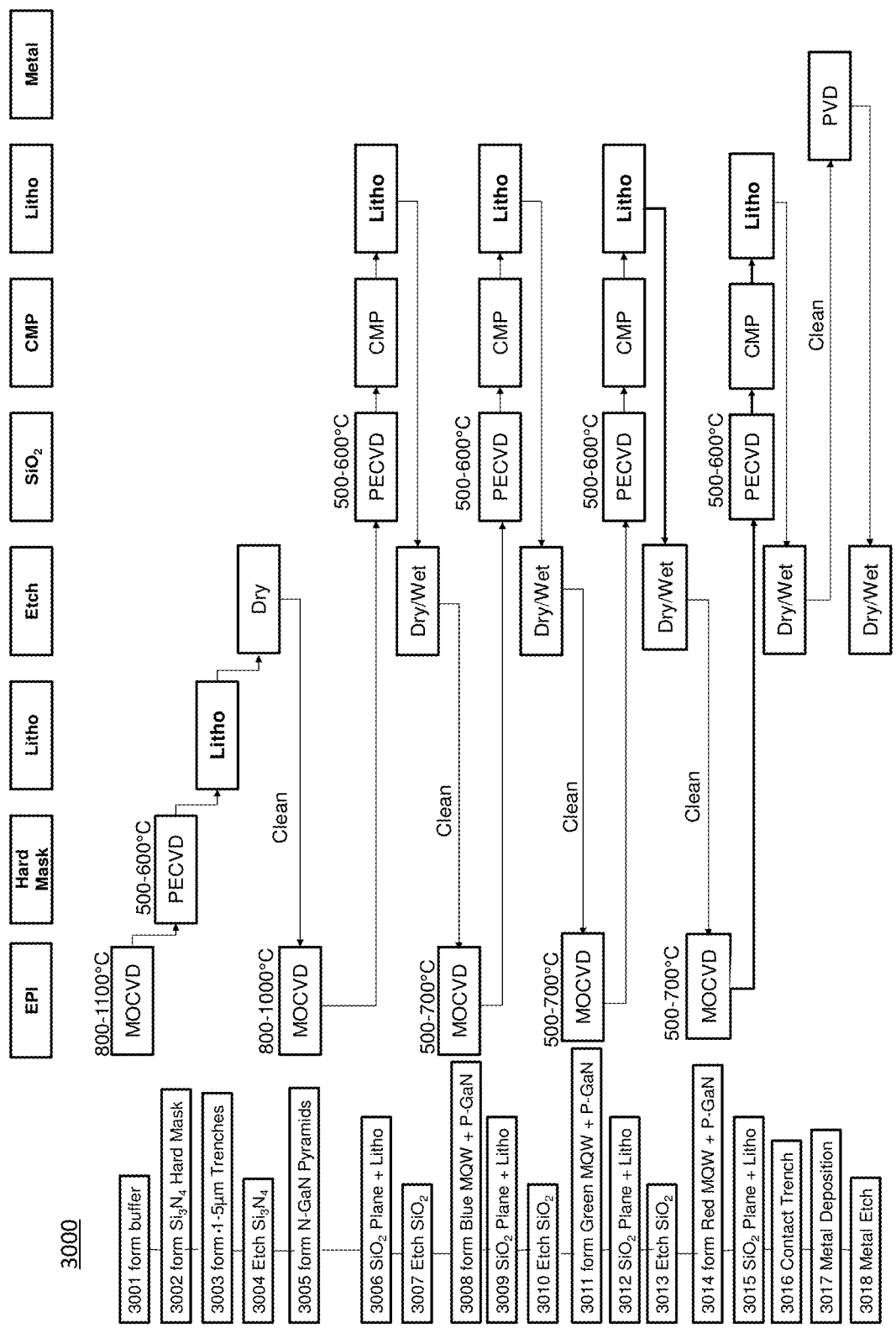
FIG. 3 illustrates a logic flow of a method for producing micro LEDs according to an embodiment.

Various embodiments may be generally directed to a micro display including LEDs and electronic control circuits. In particular, the present disclosure may be implemented to produce micro displays on silicon, silicon carbide, or sapphire wafers with electronic control circuits. Accordingly, such micro displays can be provided with such electronic control circuits on the same substrate. Thus it can be said that the such micro displays are monolithically formed (e.g., from the same substrate, or the like) with the electronic control circuits. The display may include red, green, and blue micro LEDs, for example, and electronic control circuits include TFTs with Indium gallium zinc oxide (IGZO) channels or Indium phosphide (InP) channels, for example, which LEDs and TFT electronic control circuits are manufactured monolithically on the same wafer.

In augmented reality, where the image is projected against the real world environment, high brightness (e.g., greater than 2,000 cd/m$^2$) is desired to render data or images that can be viewed even in ambient lighting or when used with inefficient lenses or waveguides. Some additional desired characteristics for augmented reality applications are (i) a high contrast ratio so that the projected display area does not glow and become washed out relative to the surroundings, (ii) low power and a compact form factor which are important for head mounted displays, and (iii) high pixel densities, e.g., pixel density of >2500 pixel per inch (PPI) is required for head mounted displays. Micro LED displays have many of these desired characteristics for HMD applications.

FIG. 1a illustrates a layer sequence of the monolithic construction of a micro display 1000 including micro LEDs and electronic control circuits made of TFTs according to an embodiment. The micro display may be configured to achieve a pixel density of >3000 pixels per inch (PPI), for example, which pixel density may be desired for head-mounted displays. In addition, the micro display may be configured to achieve a pixel density of >4665 pixels per inch (PPI), for example, which pixel density may be desired for augmented reality (AR) devices. It is noted, that reference to the term micro display, for example, micro display 1000, as used herein does not preclude the present disclosure from being implemented with displays referred to as nano displays, or other such displays.

To construct the micro display 1000 shown in FIG. 1a, starting with a substrate wafer 1001, which may be silicon or sapphire, for example, a micro LED layer 1002 is built on top of the substrate wafer 1001. The micro LED layer 1002 includes red (R) micro LEDs 1004, green (G) micro LEDs 1005 and blue (B) micro LEDs 1006, which may be produced using nanowire or micro pyramid approach, for example. It should be readily apparent that multiple R, G, B micro LEDs 1004-1006 may be provided. It should be noted that R, G, and B colors for the micro LEDs 1004-1006 are merely examples, and other colors and shades may be readily implemented. For example, yellow and cyan micro LEDs may be provided. The examples are not limiting in this context. After the R, G, and B micro LEDs 1004-1006 of the layer 1002 are produced on the substrate wafer 1001, an electronic control circuit layer 1003 is monolithically produced above the micro LED layer 1002. The electronic control circuit layer 1003 includes electronic control circuits 1007 made of TFTs, which electronic control circuits 1007 are positioned at a laterally different area from the micro LEDs 1004-1006 of the layer 1002 and paths of light emissions from the micro LEDs 1004-1006 to prevent light blocking by the TFTs of the electronic control circuits 1007. This is also shown in FIG. 1B, which illustrates the relative lateral positions of the TFT electronic control circuits 1007 and the R, G, and B micro LEDs 1004-1006 as viewed from the top perspective.

FIG. 2 illustrates the connection of the TFT electronic control circuits 1007 to the R, G, B micro LEDs 1004-1006 and to driver circuits, e.g., scan driver 2002 and data driver 2001, according to an embodiment. The TFTs of the TFT electronic control circuits 1007 are connected to associated R, G, B micro LEDs 1004-1006, as well as to data lines 2003 and gates lines 2004, which data lines and gates lines are in turn connected to data driver 2001 and scan driver 2002, respectively. In this manner, the timing of the TFT switching is controlled by the data driver 2001 and scan driver 2002, which data driver 2001 and scan driver 2002 may be implemented by crystalline silicon complementary metal-oxide-semiconductor (CMOS) integrated circuits.

The process logic flow 3000 for manufacturing R, G, and B micro LEDs on a wafer is described in greater detail by reference to FIGS. 3 and 4a-4h. For the sake of clarity, the process logic flow 3000 is summarized on the left side of FIG. 3 as numbered blocks, and additional information regarding each numbered block is shown on the right side of FIG. 3. In addition, FIGS. 4a-4h illustrate cross-sectional views of component layers at various stages of manufacturing R, G, B micro LEDs.

In block 3001 of FIG. 3, a buffer layer (4001 shown in FIG. 4a) is formed on a substrate (1001 shown in FIG. 4a) by metalorganic chemical vapor deposition (MOCVD) at 800-1100° C. In block 3002 of FIG. 3, $Si_3N_4$ hard mask (4002 shown in FIG. 4a) is formed on top of the buffer layer (4001 shown in FIG. 4a) by plasma-enhanced chemical vapor deposition (PECVD) at 500-600° C. In block 3003 of FIG. 3, 0.1-5 μm width trenches (4003 shown in FIG. 4a) are formed in the $Si_3N_4$ hard mask by photolithography. Subsequently, dry etching of $Si_3N_4$ hard mask is performed in block 3004 of FIG. 3, followed by block 3005 in which N—GaN pyramids (4004 shown in FIG. 4b) are formed by metalorganic chemical vapor deposition (MOCVD) at 800-1100° C. In block 3006, $SiO_2$ layer (4050 shown in FIG. 4c) is formed on top of the $Si_3N_4$ hard mask and the N—GaN pyramids by plasma-enhanced chemical vapor deposition (PECVD) at 500-600° C., followed by chemical-mechanical planarization (CMP) and photolithography.

After etching of the $SiO_2$ layer in block 3007 of FIG. 3, blue multiple quantum well (MQW) (4005 shown in FIG. 4c) and P—GaN region (4006 shown in FIG. 4c) are formed in block 3008 on top of the N—GaN pyramid for the blue micro LED by MOCVD at 500-700° C. In block 3009, planarization of $SiO_2$ layer is repeated by PECVD at 500-600° C., followed by CMP and photolithography. After etching of the $SiO_2$ layer in block 3010 of FIG. 3, green multiple quantum well (MQW) (4007 shown in FIG. 4d) and P—GaN region (4008 shown in FIG. 4d) are formed in block 3011 on top of the N—GaN pyramid for the green micro LED by MOCVD at 500-700° C. In block 3012, planarization of $SiO_2$ layer is repeated by PECVD at 500-600° C., followed by CMP and photolithography. After etching of the $SiO_2$ layer in block 3013 of FIG. 3, red multiple quantum well (MQW) (4009 shown in FIG. 4e) and P—GaN region (4010 shown in FIG. 4e) are formed in block 3014 on top of the N—GaN pyramid for the red micro LED by MOCVD at 500-700° C. Planarization of $SiO_2$ layer (4050 shown in FIG. 4f) is repeated in block 3015 by PECVD at 500-600° C., followed by CMP and photolithography. Subsequently, contact trenches (4011 shown in FIG. 4g) are formed in block 3016 by etching, followed by formation of transparent metal (4012 shown in FIG. 4h) in the contact trenches by physical vapor deposition (PVD) in block 3017 and metal etching in block 3018.

Figure 4A:
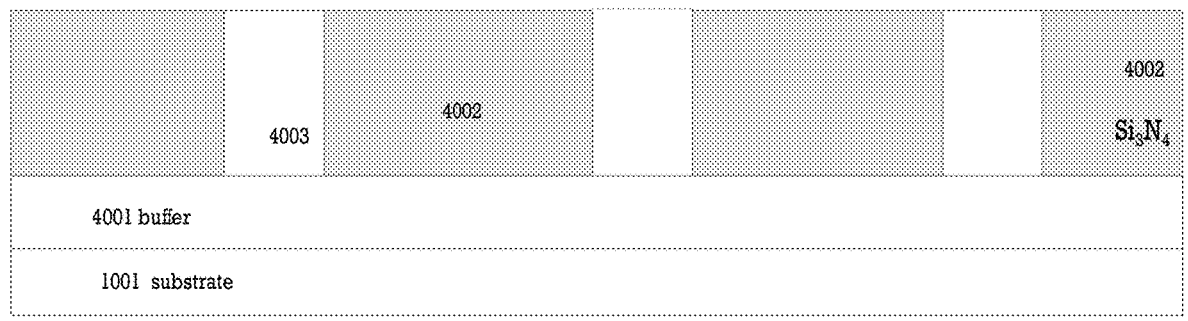
FIGS. 4a-4h illustrate cross-sectional views of component layers at different stages of manufacturing a micro LED according to an embodiment.
Figure 4B:
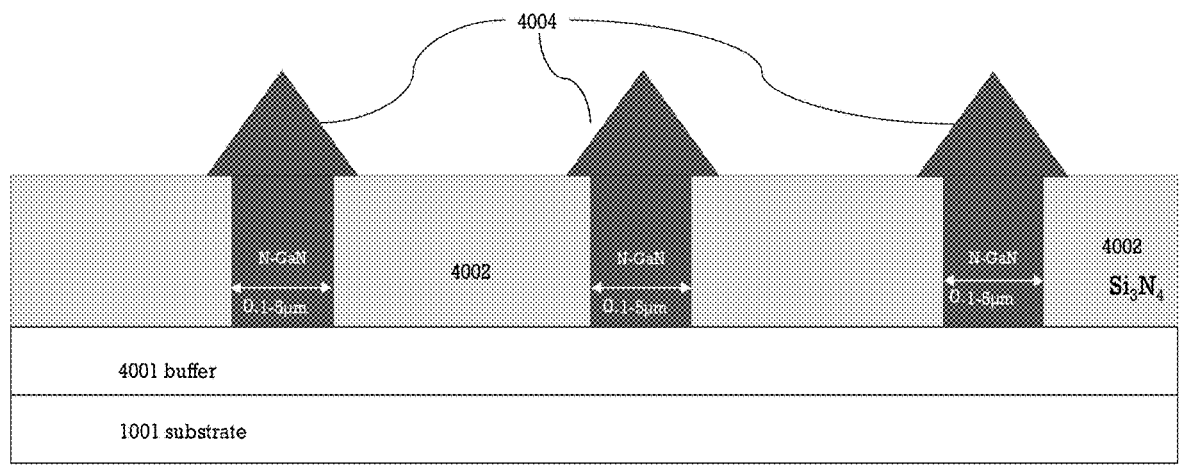
Figure 4C:
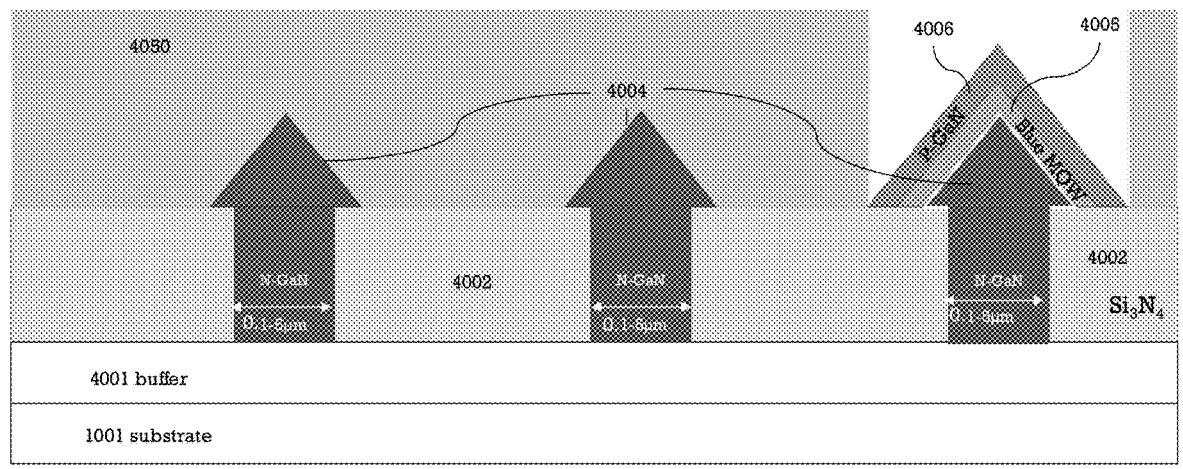
Figure 4D:
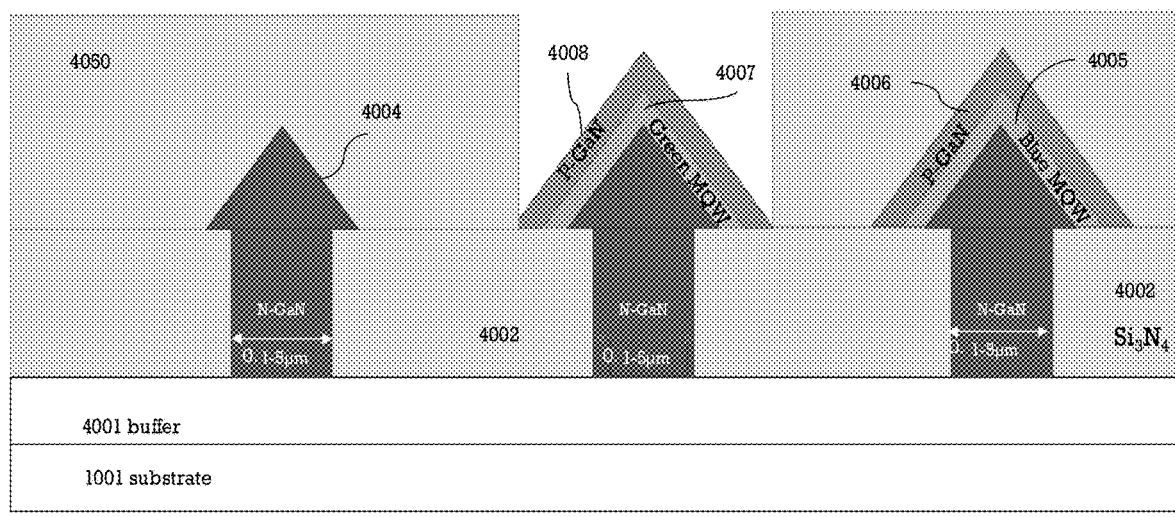
Figure 4E:
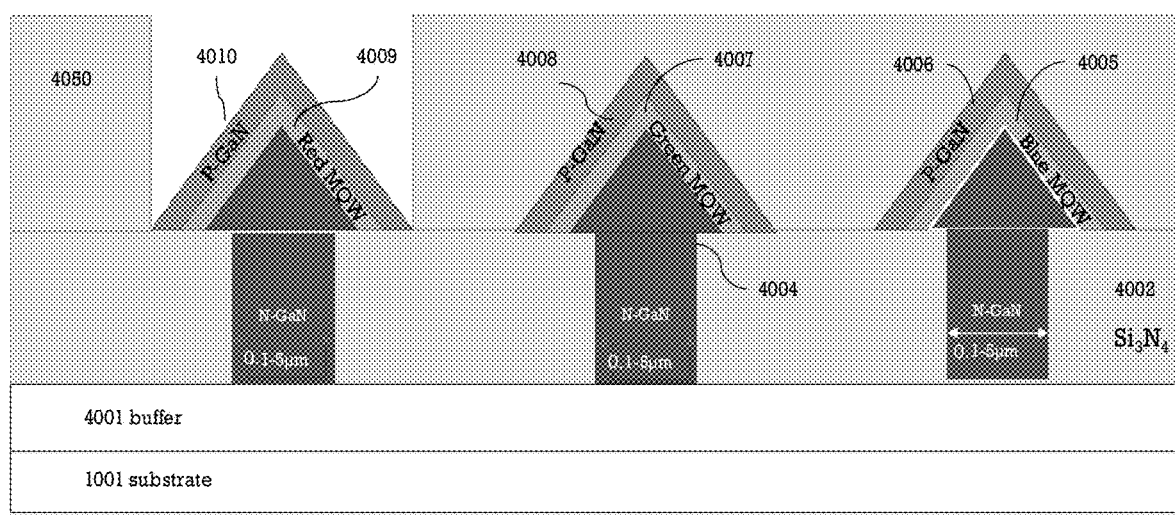
Figure 4F:
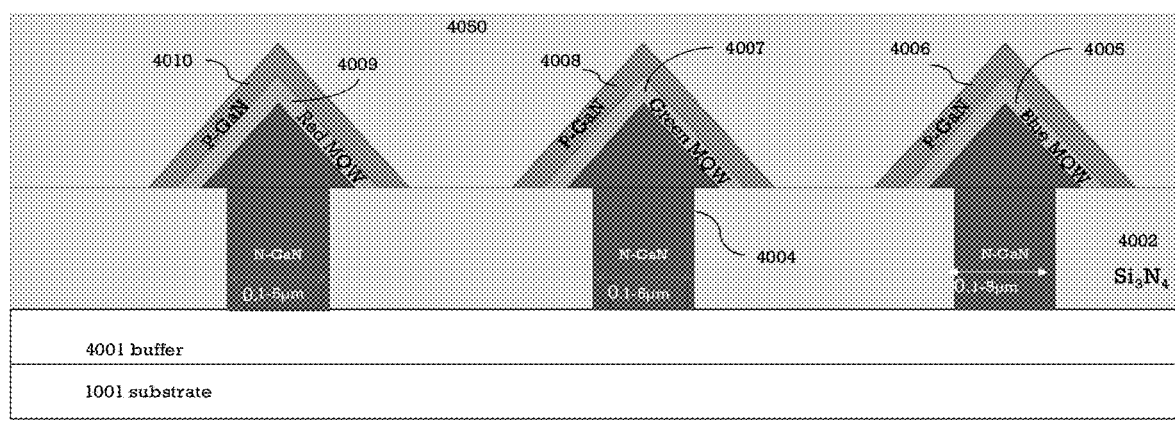
Figure 4G:
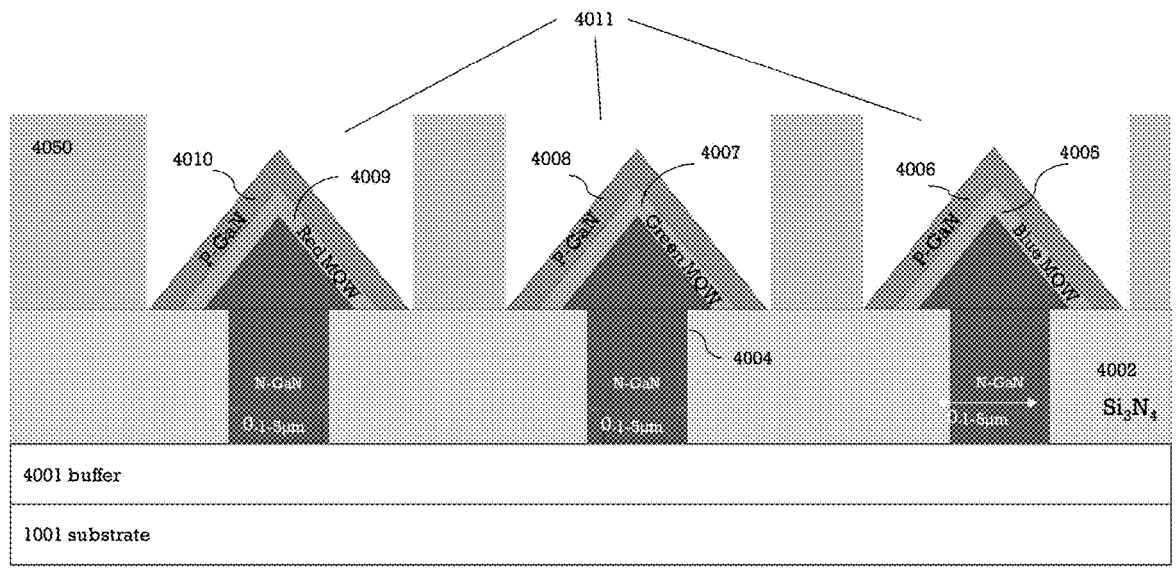
Figure 4H:
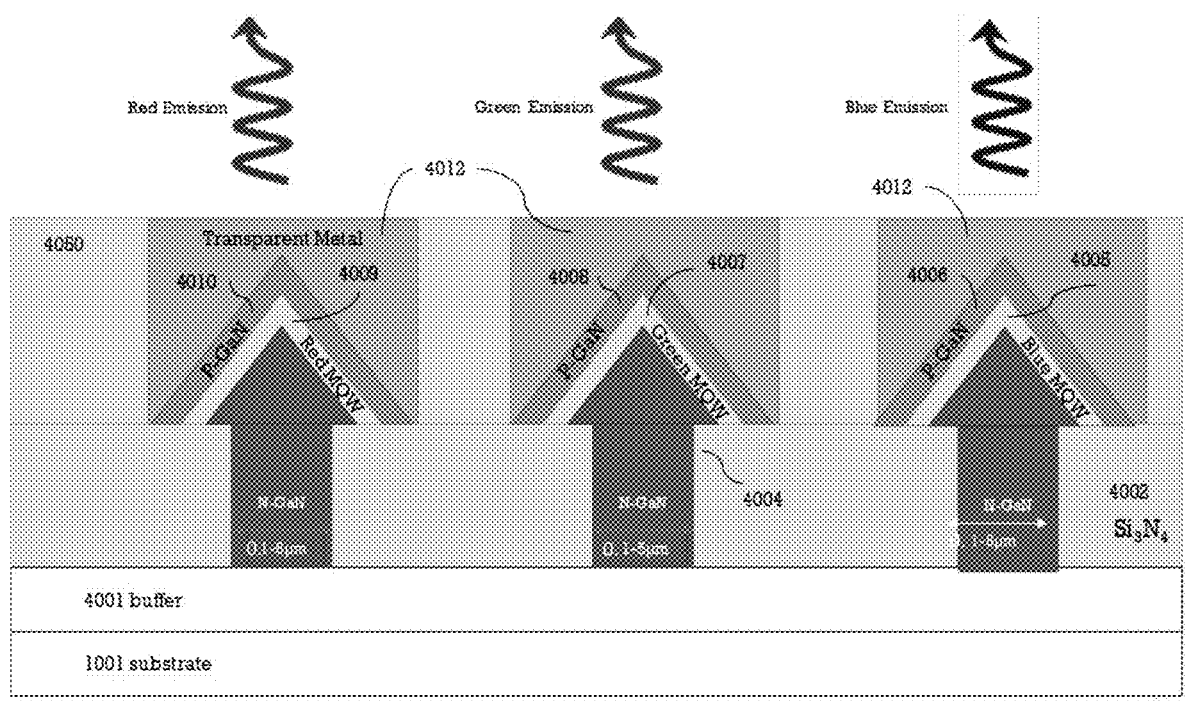

The layer configuration shown in FIG. 4h corresponds to the substrate 1001 and micro LED layer 1002 shown in FIG. 1a. The portion including red MQW 4009 and P—GaN region 4010 in FIG. 4h corresponds to the red micro LED 1004 shown in FIGS. 1a and 1b; the portion including green MQW 4007 and P—GaN region 4008 in FIG. 4h corresponds to the green micro LED 1005 shown in FIGS. 1a and 1b; and the portion including blue MQW 4005 and P—GaN region 4006 in FIG. 4h corresponds to the blue micro LED 1006 shown in FIGS. 1a and 1b. As noted above, red, green and blue colors for the micro LEDs 1004-1006 are merely examples, and other colors and shades may be readily implemented.

After the layer configuration shown in FIG. 4h (corresponding to the substrate 1001 and micro LED layer 1002 shown in FIG. 1a) has been produced, the electronic control circuit layer 1003 including TFT electronic control circuit 1007 shown in FIG. 1a is monolithically produced on top of the micro LED layer. FIGS. 5a-5h illustrate cross-sectional views of component layers at different stages of manufacturing a TFT of the TFT electronic control circuit on top of the micro LED layer according to an embodiment in which the TFT includes an Indium gallium zinc oxide (IGZO) channel. Although FIGS. 5a-5h show the manufacturing process flow for a single TFT of the TFT electronic control circuit for the sake of clarity, it should be readily apparent that the illustrated manufacturing process flow may be applied to multiple TFTs. In addition, a process logic flow 500 for manufacturing a TFT of the TFT electronic control circuit monolithically on top of the micro LED layer is shown in FIG. 9, which process logic flow 500 corresponds to the manufacturing process flow depicted in FIGS. 5a-5h.

FIG. 5a schematically illustrates the substrate wafer with monolithic R, G, B micro LEDs of the micro LED layer, which layer configuration is designated by reference numeral 5001 and corresponds to the layer configuration shown in FIG. 4h. Next, as shown in FIG. 5b and block 510 of FIG. 9, buffer oxide (e.g., $SiO_2$) layer 5002 is deposited on top of the layer configuration 5001. Subsequently, gate metal material 5003 is deposited and patterned (shown in FIG. 5c and block 520 of FIG. 9), followed by deposition of gate dielectric (e.g., $SiO_2$) layer 5004 (shown in FIG. 5d and block 530 of FIG. 9). The gate dielectric layer 5004 may be deposited by atomic layer deposition or plasma-enhanced chemical vapor deposition (PECVD), for example.

Next, as shown in FIG. 5e and block 540 of FIG. 9, the channel layer 5005 is deposited on the gate dielectric layer 5004. In this embodiment, the channel layer 5005 is formed as Indium gallium zinc oxide (IGZO) channel layer, which may be deposited by atomic layer deposition (e.g., thickness of 10-50 nm) at a temperature <500° C. The channel mobility may be in the range of 20-70 $cm^2/V$-s. Interlayer dielectric 5006 (shown in FIG. 5f and block 550 of FIG. 9) is then deposited on top of the channel layer 5005, followed by opening of the source contact 5007 and drain contact 5008 (shown in FIG. 5g and block 560 of FIG. 9), e.g., by etching. Finally, as shown in FIG. 5h and block 570 of FIG. 9, source metal portion 5009 and drain metal portion 5010 are formed by deposition and patterning. The resulting TFT 5010 shown in FIG. 5h is part of a monolithic construction of a micro display which also includes the layer configuration 5001 corresponding to the substrate wafer with monolithic R, G, B micro LEDs of the micro LED layer. As described in connection with FIGS. 1a and 1b, the TFT 5010 is positioned at a laterally different area from the R, G, B micro LEDs of the layer configuration 5001 to prevent light blocking by the TFT.

FIGS. 6a-6g illustrate cross-sectional views of component layers at different stages of manufacturing a TFT of the TFT electronic control circuit on top of the micro LED layer according to another embodiment in which the TFT includes an Indium phosphide (InP) channel. Although FIGS. 6a-6g show the manufacturing process flow for a single TFT of the TFT electronic control circuit for the sake of clarity, it should be readily apparent that the illustrated manufacturing process flow may be applied to multiple TFTs. In addition, a process logic flow 600 for manufacturing a TFT of the TFT electronic control circuit on top of the micro LED layer is shown in FIG. 10, which process logic flow 600 corresponds to the manufacturing process flow depicted in FIGS. 6a-6g.

FIG. 6a schematically illustrates the substrate wafer with monolithic R, G, B micro LEDs of the micro LED layer, which layer configuration is designated by reference numeral 6001 and corresponds to the layer configuration shown in FIG. 4h. Next, as shown in FIG. 6b and block 610 of FIG. 10, buffer oxide (e.g., $SiO_2$) layer 6002 is deposited on top of the layer configuration 6001. Subsequently, gate metal material 6003 is deposited and patterned (shown in FIG. 6c and block 620 of FIG. 10), followed by deposition of gate dielectric in the form of gate oxide (e.g., $SiO_2$) layer 6004 (shown in FIG. 6d and block 630 of FIG. 10). The gate dielectric layer 6004 may be deposited by atomic layer deposition or plasma-enhanced chemical vapor deposition (PECVD), for example.

Next, as shown in FIG. 6e and block 640 of FIG. 10, the channel layer 6005 is deposited on the gate dielectric (oxide) layer 6004. In this embodiment, the channel layer 6005 is formed as Indium phosphide (InP) channel layer, which may be deposited on the gate dielectric (oxide) layer using a thin-film, vapor-liquid-solid (TF-VLS) method. The TF-VLS method for forming an InP channel layer is described in greater detail below in connection with the logic flow diagram of FIG. 7, which depicts a logic flow 700 for forming the InP channel layer.

Figure 7:
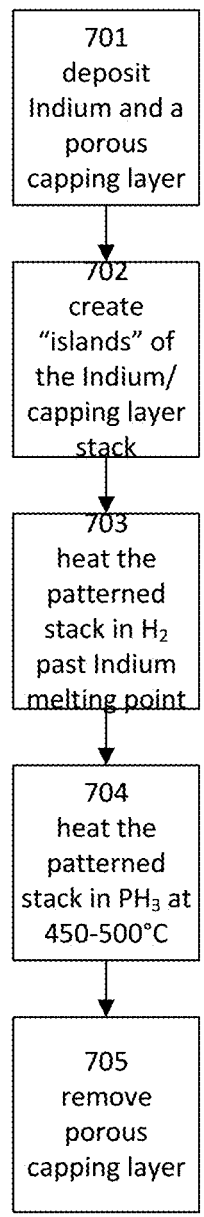
FIG. 7 illustrates a logic flow of a TF-VLS method for forming InP channel layer of the TFT shown in FIG. 6e.

As shown in block 701 of FIG. 7, Indium metal and a porous capping layer (e.g., SiOx) are deposited on the oxide substrate (e.g., gate oxide 6004 shown in FIG. 6e, which serves as gate insulator of a bottom gate thin film transistor in this example). Next, in block 702, "island" portions are formed in the Indium/capping layer stack using patterning and etching. For transistors with channel length of 10 μm and channel width of 20 μm, for example, the size of the island may be $(10+2) \times (20+2)$ μm$^2$, for example. In general, the size of an island may be up to 2500 μm$^2$, for example. Subsequently, the patterned stack is heated (shown in block 703) in $H_2$ past the melting point of Indium, followed by heating (shown in block 704) of the patterned stack in $PH_3$ gas at a temperature of approximately 450-500° C. for 1-10 minutes for phosphorization of the liquid indium by a vapor-liquid-solid growth mode, resulting in polycrystalline InP having high electron mobility (e.g., >100 cm$^2$/V-s). The "island" portions of the patterned stack define the InP channel layer. After polycrystalline InP has been formed, the porous capping layer is removed (shown in block 705), e.g., by etching.

Unlike in other growth methods (e.g., epitaxial growth using metal-organic vapor-phase epitaxy (MOVPE)) which occur "vertically," the TF-VLS growth starts at the nucleation site and first grows isotropically, until the InP reaches the SiOx capping layer, at which point the SiOx capping layer confines the InP growth to a planar thin-film geometry, allowing growth to proceed only laterally. The chemical reaction in TF-VLS growth is: Indium (liquid)+P (gas)→InP (solid). This reaction is thermodynamically driven as the concentration of P in the liquid Indium is kept high enough that the Gibbs free energy of that side of the reaction is higher than the InP side, resulting in the desired product. A change in the process temperature primarily changes (i) the solubility of P in liquid Indium, and (ii) the Indium/P ratio in solid InP. It should be noted that a growth temperature of 450° C. is sufficient to crack PH3 to produce the necessary P for the above reaction to occur.

After InP channel 6005 shown in FIG. 6e has been produced, the metal layer 6006 is deposited on the InP channel layer 6004 (shown in FIG. 6f and block 650 of FIG. 10). Finally, as shown in FIG. 6g and block 660 of FIG. 10, source metal portion 6007 and drain metal portion 6008 are formed by patterning of the metal layer 6006, and the resulting structure is subjected to thermal annealing in $N_2$ at approximately 350° C. The resulting TFT 6010 shown in FIG. 6g is part of a monolithic construction of a micro display which also includes the layer configuration 6001 corresponding to the substrate wafer with monolithic R, G, B micro LEDs of the micro LED layer. As described in connection with FIGS. 1a and 1b, the TFT 6010 is positioned at a laterally different area from the R, G, B micro LEDs of the layer configuration 6001 to prevent light blocking by the TFT.

In order to meet the high PPI specification for augmented reality (AR) devices, small micro LEDs and small TFTs have to be used. The equations used to estimate the pixel area as a function of micro LED and TFT sizes are shown below.

$$\text{Pixel Side} \approx \sqrt{\text{PixelArea}}$$

$$\text{Pixel Area} \approx \pi(\mu\text{LED Area} + \text{TFT Circuit Area})$$

$$\mu\text{LED Area} \approx 3(\mu\text{LED Side})^2$$

$$\text{TFT Circuit Area} \approx 3 \times 6 \times W_{TFT} \times L_{TFT}$$

Figure 8:
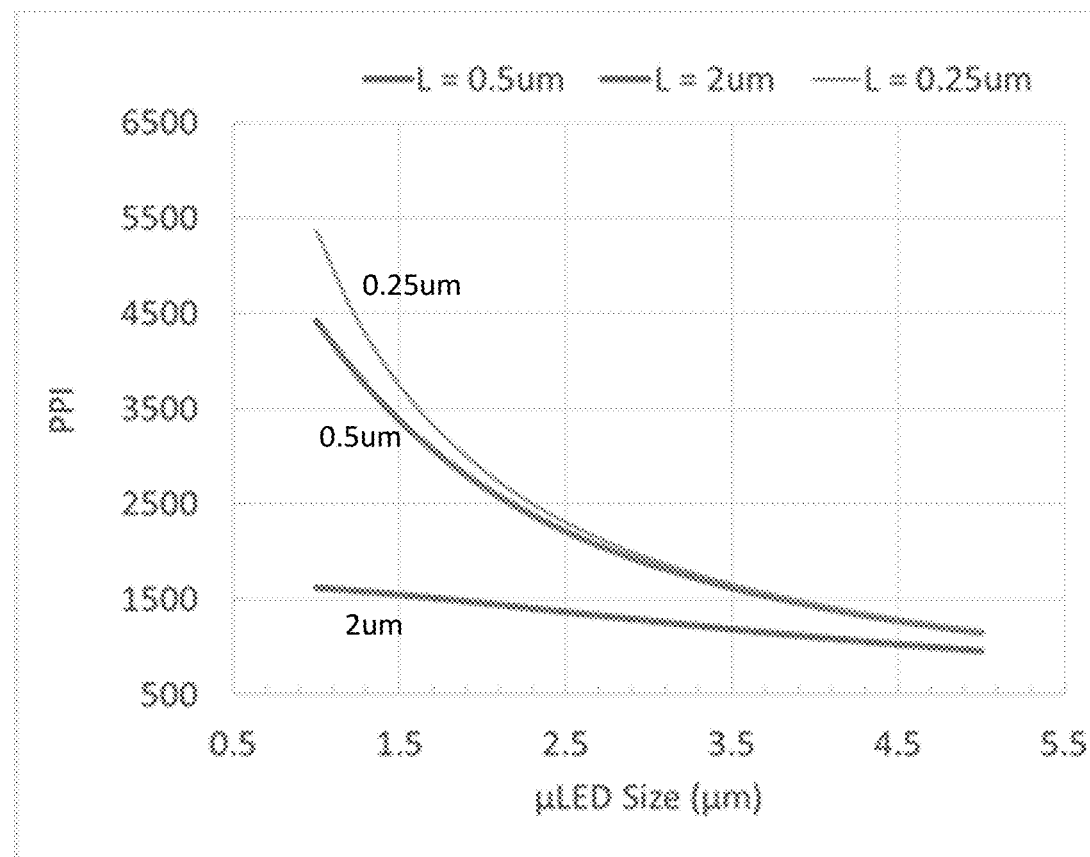
FIG. 8 illustrates a chart showing PPI versus micro LED size for different TFT sizes.

The calculated PPI as a function of micro LED size is shown in FIG. 8. As can be seen from FIG. 8, it is evident that micro LEDs with sizes close to 1 micrometer and TFTs with width and length of 0.5 um and 0.25 um are required to achieve PPI=4665, which is desired for AR devices, for example.

The micro displays described above, which include micro LEDs on a wafer and TFT electronic control circuits produced monolithically on the same wafer, provide several advantages, e.g., significantly reduced power consumption, high PPI (e.g., >3000), and high brightness (e.g., >1 million nits).

FIG. 11 depicts a logic flow 1100 for forming a micro display which includes micro LEDs on a wafer and TFT electronic control circuits produced monolithically on the same wafer. The logic flow 1100 can be implemented to form a micro display as described herein. In particular, the logic flow 1100 can be implemented to form micro displays shown in FIGS. 1a-1b, 5h and 6g. The logic flow 1100 could also be implemented to form micro displays having different configurations (e.g., configuration of TFTs, or the like) than the micro displays shown in FIGS. 1a-1b, 5h and 6g. The logic flow 1100 is described with reference to the micro displays shown in FIGS. 1a-1b, 5h and 6g. Examples, however, are not limited in this context.

The logic flow 1100 may begin at block 1110. At block 1110 "produce a micro LED layer including R, G, B micro LEDs on top of the substrate wafer," a micro LED layer can be produced on top of a substrate wafer. For example, micro LED layer 1002 may be built on top of substrate 1001 as depicted in FIG. 1a.

Continuing to block 1120 "produce an electronic control circuit layer above the micro LED layer, which electronic control circuit layer includes electronic control circuits made of TFTs which are positioned at a laterally different area from the micro LEDs of the micro LED layer," an electronic control circuit layer is produced above the micro LED layer, which electronic control circuit layer includes electronic control circuits made of TFTs which are positioned at a laterally different area from the micro LEDs of the micro LED layer. For example, electronic control circuit layer 1003 can be produced above the micro LED layer 1002, as depicted in FIG. 1a.

Figure 12:
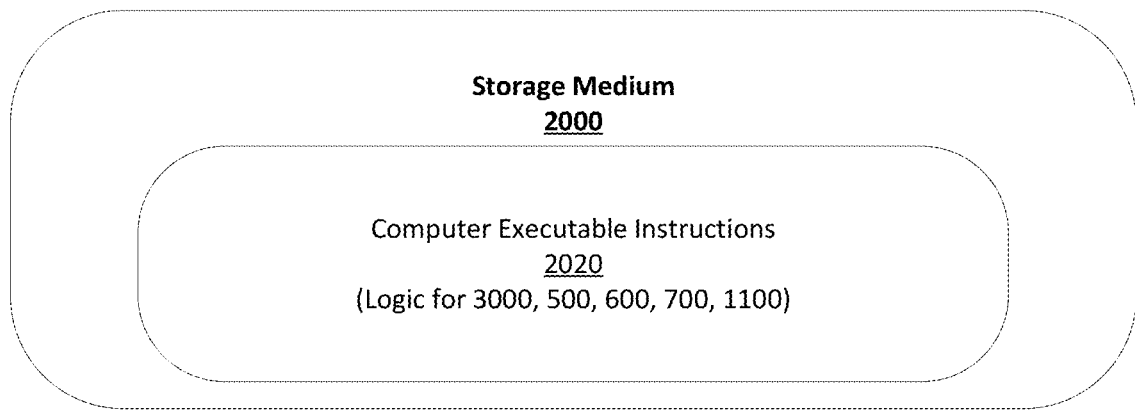
FIG. 12 illustrates a computer-readable storage medium according to an embodiment.

FIG. 12 illustrates an embodiment of a storage medium 2000. The storage medium 2000 may comprise an article of manufacture. In some examples, the storage medium 2000 may include any non-transitory computer readable medium or machine readable medium, such as an optical, magnetic or semiconductor storage. The storage medium 2000 may store various types of computer executable instructions e.g., 2020). For example, the storage medium 2000 may store various types of computer executable instructions to implement techniques 3000, 500, 600, 700, and 1100. For example, the storage medium 2000 may store various types of computer executable instructions to implement technique 3000, 500, 600, 700, and 1100, which instructions can be executed by a specially programmed computer system operably coupled to manufacturing tools to carry out the micro display manufacturing techniques described herein.

Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 13:
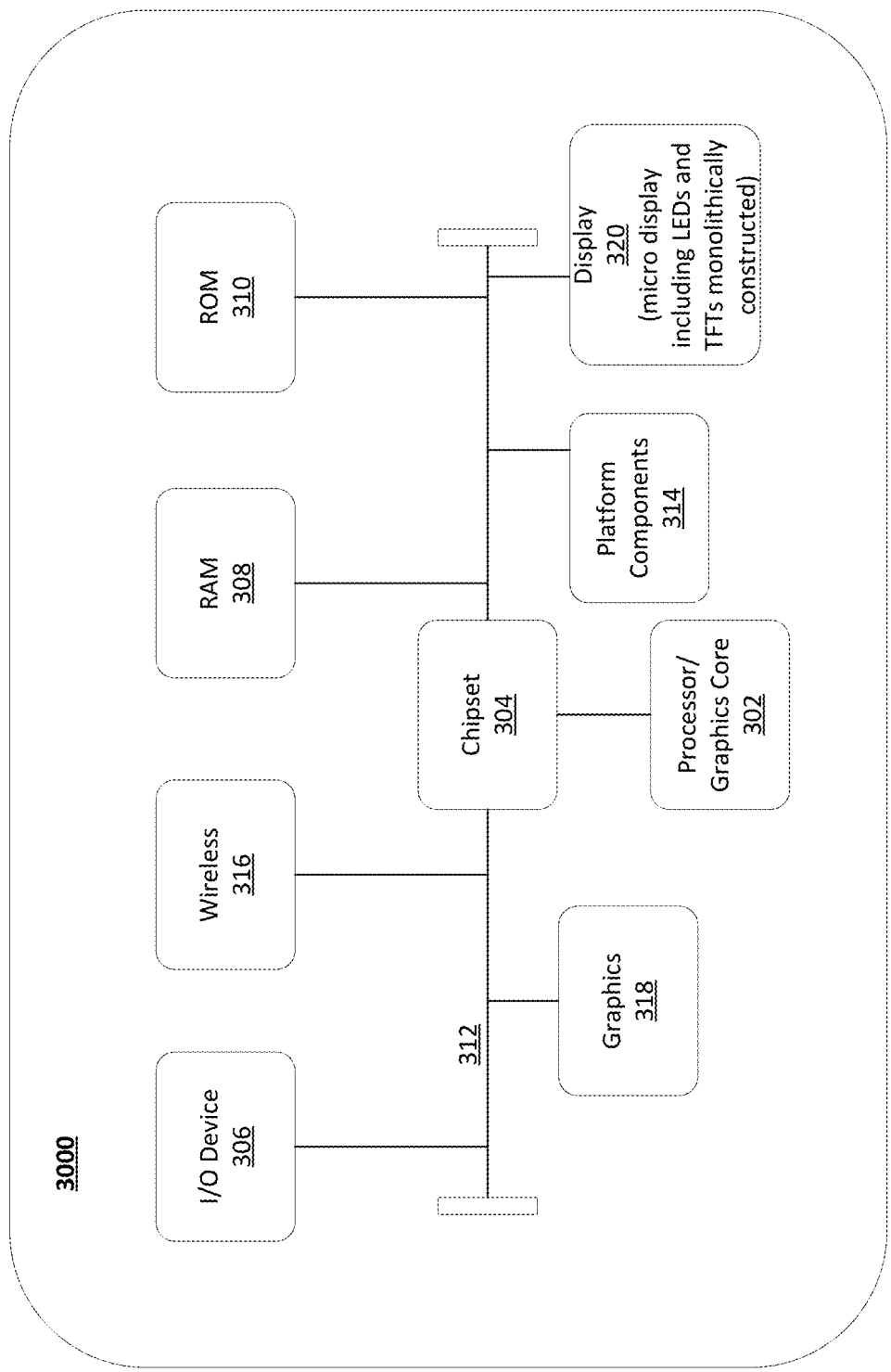
FIG. 13 illustrates a system according to an embodiment.

FIG. 13 is a diagram of an exemplary system embodiment and in particular, depicts a platform 3000, which may include various elements. For instance, this figure depicts that platform (system) 3000 may include a processor/graphics core 302, a chipset 304, an input/output (I/O) device 306, a random access memory (RAM) (such as dynamic RAM (DRAM)) 308, and a read only memory (ROM) 310, display 320 (e.g., a micro display 1000 including micro LEDs 1004-1006 and TFT electronic control circuit 1007), and various other platform components 314 (e.g., a fan, a cross flow blower, a heat sink, DTM system, cooling system, housing, vents, and so forth). System 3000 may also include wireless communications chip 316 and graphics device 318. The embodiments, however, are not limited to these elements.

As depicted, I/O device 306, RAM 308, and ROM 310 are coupled to processor 302 by way of chipset 304. Chipset 304 may be coupled to processor 302 by a bus 312. Accordingly, bus 312 may include multiple lines.

Processor 302 may be a central processing unit comprising one or more processor cores and may include any number of processors having any number of processor cores. The processor 302 may include any type of processing unit, such as, for example, CPU, multi-processing unit, a reduced instruction set computer (RISC), a processor that have a pipeline, a complex instruction set computer (CISC), digital signal processor (DSP), and so forth. In some embodiments, processor 302 may be multiple separate processors located on separate integrated circuit chips. In some embodiments processor 302 may be a processor having integrated graphics, while in other embodiments processor 302 may be a graphics core or cores.

Some embodiments may be described using the expression "one embodiment" or "an embodiment" along with their derivatives. These terms mean that a particular feature, structure, or characteristic described in connection with the embodiment is included in at least one embodiment. The appearances of the phrase "in one embodiment" in various places in the specification are not necessarily all referring to the same embodiment. Further, some embodiments may be described using the expression "coupled" and "connected" along with their derivatives. These terms are not necessarily intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other. Furthermore, aspects or elements from different embodiments may be combined.

It is emphasized that the Abstract of the Disclosure is provided to allow a reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

What has been described above includes examples of the disclosed architecture. It is, of course, not possible to describe every conceivable combination of components and/or methodologies, but one of ordinary skill in the art may recognize that many further combinations and permutations are possible. Accordingly, the novel architecture is intended to embrace all such alterations, modifications and variations that fall within the spirit and scope of the appended claims. The detailed disclosure now turns to providing examples that pertain to further embodiments. The examples provided below are not intended to be limiting.

Example 1

An apparatus, comprising: a display comprising: a plurality of light emitting diodes (LEDs) provided on a substrate wafer; and a plurality of thin film transistors (TFTs) operatively connected to the plurality of LEDs and provided on the substrate wafer, the plurality of TFTs positioned at least partially on the plurality of LEDs.

Example 2

The apparatus of Example 1, the plurality of LEDs comprising red, green and blue micro LEDs.

Example 3

The apparatus of Example 1, the plurality of TFTs formed monolithically with the plurality of LEDs, and the TFTs to control the plurality of LEDs.

Example 4

The apparatus of Example 1, the plurality of TFTs laterally removed from paths of light emissions from the plurality of LEDs.

Example 5

The apparatus of Example 1, the plurality of LEDs comprising red, green and blue micro LEDs in a micro LED layer, and the plurality of TFTs formed in a TFT layer positioned at least partially on the micro LED layer.

Example 6

The apparatus of Example 1, the TFTs having an indium gallium zinc oxide (IGZO) channel.

Example 7

The apparatus of Example 1, the TFTs having an indium phosphide (InP) channel.

Example 8

The apparatus of Example 2, the plurality of TFTs laterally removed from paths of light emissions from the plurality of LEDs.

Example 9

A system, comprising: a display comprising: a plurality of light emitting diodes (LEDs) provided on a substrate wafer; and a plurality of thin film transistors (TFTs) operatively connected to the plurality of LEDs and provided on the substrate wafer, the plurality of TFTs positioned at least partially on the plurality of LEDs; and at least one driver circuit connected to the plurality of TFTs, the at least one driver circuit to assert control signals to the plurality of TFTs, the control signals to cause the plurality of TFTs to selectively turn on or off the plurality of LEDs.

Example 10

The system of Example 9, the plurality of TFTs formed monolithically with the plurality of LEDs, and the plurality of LEDs comprising red, green and blue micro LEDs.

Example 11

The system of Example 9, the plurality of TFTs laterally removed from paths of light emissions from the plurality of LEDs.

Example 12

The system of Example 10, the plurality of TFTs laterally removed from paths of light emissions from the plurality of LEDs.

Example 13

The system of Example 9, the plurality of LEDs comprising red, green and blue micro LEDs in a micro LED layer, and the plurality of TFTs formed in a TFT layer positioned at least partially on the micro LED layer.

Example 14

The system of Example 9, the TFTs having an indium gallium zinc oxide (IGZO) channel.

Example 15

The system of Example 9, the TFTs having an indium phosphide (InP) channel.

Example 16

The system of Example 9, the at least one driver circuit comprising: a data driver connected to the plurality of TFTs; and a scan driver connected to the plurality of TFTs.

Example 17

A method comprising: forming a plurality of light emitting diodes (LEDs) on a substrate wafer; and forming a plurality of thin film transistors (TFTs) operatively connected to the plurality of LEDs and provided on the substrate wafer, the plurality of TFTs positioned at least partially on the plurality of LEDs.

Example 18

The method of Example 17, the plurality of TFTs formed monolithically with the plurality of LEDs, the plurality of TFTs formed laterally removed from paths of light emissions from the plurality of LEDs.

Example 19

The method of Example 17, the forming of the plurality of TFTs comprising: forming a gate on an oxide layer; forming a gate dielectric above the gate; forming a channel layer above the gate dielectric; and forming a source metal and a drain metal.

Example 20

The method of Example 19, the channel layer formed by deposition of indium gallium zinc oxide (IGZO) material.

Example 21

The method of Example 20, indium gallium zinc oxide (IGZO) material deposited by atomic layer deposition (ALD) at a temperature less than 350° C.

Example 22

The method of Example 20, further comprising: forming an interlayer dielectric on the channel layer; and etching selected regions of the interlayer dielectric to expose source contact region and drain contact region of the channel layer, the source metal and drain metal provided in the etched selected regions, the source metal in contact with the source contact region, and the drain metal in contact with the drain contact region.

Example 23

The method of Example 19, the channel layer formed by deposition of indium phosphide (InP) material.

Example 24

The method of Example 23, indium phosphide (InP) material deposited by a thin-film, vapor-liquid-solid (TF-VLS) method.

Example 25

The method of Example 24, the thin-film, vapor-liquid-solid (TF-VLS) method of deposition of indium phosphide (InP) material comprising: depositing indium and a capping layer above indium to form a stack; patterning the stack to form islands in the stack; heating the patterned stack in $PH_3$ at a temperature of approximately 450-500° C. to form indium phosphide (InP); and removing the capping layer.

Example 26

An apparatus, comprising: a display means comprising: a plurality of light emitting means provided on a substrate wafer; and a plurality of switching means operatively connected to the plurality of light emitting means and provided on the substrate wafer, the plurality of switching means positioned at least partially on the plurality of light emitting means.

Example 27

The apparatus of Example 26, the plurality of light emitting means comprising red, green and blue micro light emitting means.

Example 28

The apparatus of Example 26, the plurality of switching means formed monolithically with the plurality of light emitting means, and the plurality of switching means to control the plurality of light emitting means.

Example 29

The apparatus of Example 26, the plurality of switching means laterally removed from paths of light emissions from the plurality of light emitting means.

Example 30

The apparatus of Example 26, the plurality of light emitting means comprising red, green and blue micro light emitting means in a micro light emitting means layer, and the plurality of switching means formed in a switching means layer positioned at least partially on the micro light emitting means layer.

Example 31

The apparatus of Example 26, the switching means having an indium gallium zinc oxide (IGZO) channel.

Example 32

The apparatus of Example 26, the switching means having an indium phosphide (InP) channel.

Example 33

The apparatus of Example 31, the switching means having a bottom-gate structure.

Example 34

The apparatus of Example 32, the switching means having a bottom-gate structure.

Example 35

The apparatus of Example 26, further comprising: at least one driver circuit means connected to the plurality of switching means, the at least one driver circuit means to assert control signals to the plurality of switching means, the control signals to cause the plurality of switching means to selectively turn on or off the plurality of light emitting means.

Example 36

The apparatus of Example 35, the plurality of light emitting means comprising red, green and blue micro light emitting means.

Example 37

The apparatus of Example 35, the plurality of switching means laterally removed from paths of light emissions from the plurality of light emitting means.

Example 38

The apparatus of Example 36, the plurality of switching means laterally removed from paths of light emissions from the plurality of light emitting means.

Example 39

The apparatus of Example 35, the plurality of light emitting means comprising red, green and blue micro light emitting means in a micro light emitting means layer, and the plurality of switching means formed in a switching means layer positioned at least partially on the micro light emitting means layer.

Example 40

The apparatus of Example 35, the switching means having an indium gallium zinc oxide (IGZO) channel.

Example 41

The apparatus of Example 35, the switching means having an indium phosphide (InP) channel.

Example 42

The apparatus of Example 35, the at least one driver circuit means comprising: a data driver means connected to the plurality of switching means; and a scan driver means connected to the plurality of switching means.

13

Example 43

A system, comprising: a display comprising: a plurality of light emitting means provided on a substrate wafer; and a plurality of switching means forming an electronic control circuit means operatively connected to the plurality of light emitting means and provided on the substrate wafer, the plurality of switching means positioned at least partially on the plurality of light emitting means; and at least one driver circuit means connected to the plurality of switching means, the at least one driver circuit means to assert control signals to the plurality of switching means, the control signals to cause the electronic control circuit means to selectively turn on or off the plurality of lighting emitting means.

Example 44

The system of Example 43, the plurality of light emitting means comprising red, green and blue micro light emitting means.

Example 45

The system of Example 43, the plurality of switching means formed monolithically with the plurality of light emitting means, and the plurality of switching means laterally removed from paths of light emissions from the plurality of light emitting means.

Example 46

The system of Example 44, the plurality of switching means laterally removed from paths of light emissions from the plurality of light emitting means.

Example 47

The system of Example 43, the plurality of light emitting means comprising red, green and blue micro light emitting means in a micro light emitting means layer, and the plurality of switching means formed in a switching means layer positioned at least partially on the micro light emitting means layer.

Example 48

The system of Example 45, the plurality of light emitting means comprising red, green and blue micro light emitting means in a micro light emitting means layer, and the plurality of switching means formed in a switching means layer positioned at least partially on the micro light emitting means layer.

Example 49

The system of Example 43, the switching means having an indium gallium zinc oxide (IGZO) channel.

Example 50

The system of Example 43, the switching means having an indium phosphide (InP) channel.

Example 51

The system of Example 43, the at least one driver circuit means comprising: a data driver means connected to the plurality of switching means; and a scan driver means connected to the plurality of switching means.

Example 52

A non-transitory, computer-readable medium storing program instructions which, when executed on a computing device, cause the computing device to carry out a method according to any one of Examples 17-25.

What is claimed is:
1. An apparatus, comprising:
a display comprising:
a plurality of light emitting diodes (LEDs) provided on a substrate wafer; and
a plurality of thin film transistors (TFTs) operatively connected to the plurality of LEDs and provided on the substrate wafer, the plurality of TFTs positioned at least partially on the plurality of LEDs and laterally removed from paths of light emissions from the plurality of LEDs.
2. The apparatus of claim 1, the plurality of LEDs comprising red, green and blue micro LEDs.
3. The apparatus of claim 1, the plurality of TFTs formed monolithically with the plurality of LEDs, and the TFTs to control the plurality of LEDs.
4. The apparatus of claim 1, the plurality of LEDs comprising red, green and blue micro LEDs in a micro LED layer, and the plurality of TFTs formed in a TFT layer positioned at least partially on the micro LED layer.
5. The apparatus of claim 1, the TFTs having an indium gallium zinc oxide (IGZO) channel.
6. The apparatus of claim 1, the TFTs having an indium phosphide (InP) channel.
7. The apparatus of claim 2, the plurality of TFTs laterally removed from paths of light emissions from the plurality of LEDs.
8. A system, comprising:
a display comprising:
a plurality of light emitting diodes (LEDs) provided on a substrate wafer; and
a plurality of thin film transistors (TFTs) operatively connected to the plurality of LEDs and provided on the substrate wafer, the plurality of TFTs positioned at least partially on the plurality of LEDs and laterally removed from paths of light emissions from the plurality of LEDs; and
at least one driver circuit connected to the plurality of TFTs, the at least one driver circuit to assert control signals to the plurality of TFTs, the control signals to cause the plurality of TFTs to selectively turn on or off the plurality of LEDs.
9. The system of claim 8, the plurality of TFTs formed monolithically with the plurality of LEDs, and the plurality of LEDs comprising red, green and blue micro LEDs.
10. The system of claim 9, the plurality of TFTs laterally removed from paths of light emissions from the plurality of LEDs.
11. The system of claim 8, the plurality of LEDs comprising red, green and blue micro LEDs in a micro LED layer, and the plurality of TFTs formed in a TFT layer positioned at least partially on the micro LED layer.
12. The system of claim 8, the TFTs having an indium gallium zinc oxide (IGZO) channel.

13. The system of claim 8, the TFTs having an indium phosphide (InP) channel.

14. The system of claim 8, the at least one driver circuit comprising:
   a data driver connected to the plurality of TFTs; and
   a scan driver connected to the plurality of TFTs.

* * * * *